(12) United States Patent
Selvamanickam et al.

(10) Patent No.: US 11,417,519 B2
(45) Date of Patent: Aug. 16, 2022

(54) HIGH MOBILITY SILICON ON FLEXIBLE SUBSTRATES

(71) Applicant: University of Houston System, Houston, TX (US)

(72) Inventors: Venkat Selvamanickam, Houston, TX (US); Pavel Dutta, Houston, TX (US); Ying Gao, Houston, TX (US)

(73) Assignee: University of Houston System, Houston, TX (US)

( * ) Notice: Subject to any disclaimer, the term of this patent is extended or adjusted under 35 U.S.C. 154(b) by 0 days.

(21) Appl. No.: 17/020,441

(22) Filed: Sep. 14, 2020

(65) Prior Publication Data

US 2020/0411306 A1    Dec. 31, 2020

Related U.S. Application Data

(63) Continuation of application No. 16/060,878, filed as application No. PCT/US2016/065672 on Dec. 8, 2016, now Pat. No. 10,777,408.

(60) Provisional application No. 62/264,417, filed on Dec. 8, 2015.

(51) Int. Cl.
*H01L 21/02* (2006.01)
*H01L 29/16* (2006.01)

(52) U.S. Cl.
CPC ...... *H01L 21/0245* (2013.01); *H01L 21/0262* (2013.01); *H01L 21/02422* (2013.01); *H01L 21/02425* (2013.01); *H01L 21/02488* (2013.01); *H01L 21/02505* (2013.01); *H01L 21/02532* (2013.01); *H01L 29/16* (2013.01)

(58) Field of Classification Search
CPC .................................................. H01L 21/0245
See application file for complete search history.

(56) References Cited

U.S. PATENT DOCUMENTS

| | | |
|---|---|---|
| 2003/0017712 A1 | 1/2003 | Brendel |
| 2006/0115964 A1 | 6/2006 | Findikoglu et al. |
| 2007/0096240 A1 | 5/2007 | Yao |
| 2008/0217622 A1 | 9/2008 | Goyal |
| 2008/0230779 A1 | 9/2008 | Goyal |
| 2008/0265255 A1 | 10/2008 | Goyal |
| 2011/0062446 A1* | 3/2011 | Goyal ............... H01L 21/02381 257/64 |
| 2014/0264459 A1 | 9/2014 | Choi et al. |

(Continued)

OTHER PUBLICATIONS

Campbell, Joe C., "Recent Advances in Telecommunications Avalanche Photodiodes," Journal of Lightwave Technology, vol. 25, No. 1, Jan. 2007.

(Continued)

*Primary Examiner* — William A Harriston
(74) *Attorney, Agent, or Firm* — Blank Rome LLP; Matthew J. Esserman (57) ABSTRACT

A semiconductor device and method for fabricating same is disclosed. Embodiments are directed to a semiconductor device and fabrication of same which include a flexible substrate and a buffer stack overlying the substrate. The buffer stack comprises at least one epitaxial buffer layer. An epitaxial doped layer comprised predominantly of silicon overlies the at least one epitaxial buffer layer. Mobility of the device is greater than 100 cm$^2$/Vs and carrier concentration of the epitaxial doped layer is less than $10^{16}$ cm$^{-3}$.

22 Claims, 10 Drawing Sheets

(56) References Cited

U.S. PATENT DOCUMENTS

| | | |
|---|---|---|
| 2015/0197844 A1 | 7/2015 | Clemens et al. |
| 2015/0318211 A1 | 11/2015 | Guo et al. |
| 2016/0049535 A1 | 2/2016 | Lochtefeld et al. |

OTHER PUBLICATIONS

Dansizoglu, et al., "A New Paradigm in High-Speed and High-Efficiency Silicon Photodiodes for Communication—Part II: Device and VLSI Integration Challenges for Low-Dimensional Structures," IEEE Transactions on Electron Devices, vol. 65, No. 2, Feb. 2018.

Findikoglu, Alp T., et al., "Well-Oriented Silicon Thin Films with High Carrier Mobility on Polycrystalline Substrates," Adv. Mater. 17, 1527-1531 (2005).

International Search Report received in corresponding PCT Application No. PCT/US2016/065672, dated Feb. 21, 2017.

Konagai, Makoto, "Present Status and Future Prospects of Silicon Thin-Film Solar Cells," Japanese Journal of Applied Physics, 50, 030001, Mar. 22, 2011.

Lee, et al., "Strained Si, SiGe, and Ge channels for high-mobility metal-oxide-semiconductor field-effect transistors," Journal of Applied Physics, 97, 011101, Dec. 9, 2004.

Selvamanickam, V., et al., "Germanium films with strong in-plane and out-of-plane texture on flexible, randomly textured metal substrates," J. Crystal Growth 311, 4553-4557 (2009).

Wang, C. P., et al., "Deposition of in-plane textured MgO on amorphous Si3N4 substrates by ion-beam-assisted deposition and comparisons with ion-beam-assisted deposited yttria-stabilized-zirconia," Appl. Phys. Lett. 71, 2955-2957 (1997).

Wang, R., et al., "High mobility single-crystalline-like germanium thin films on flexible, inexpensive substrates," Thin Solid Films 527, 9-15 (2013).

\* cited by examiner

HIGH MOBILITY SILICON ON FLEXIBLE SUBSTRATES

CROSS REFERENCE TO RELATED APPLICATION(S)

This application is a continuation of U.S. patent application Ser. No. 16/060,878, filed on Jun. 8, 2018, issuing on Sep. 15, 2020 as U.S. Pat. No. 10,777,408, which is a national phase of PCT/US16/65672, filed Dec. 8, 2016, which claims priority to U.S. provisional patent application No. 62/264,417, filed on Dec. 8, 2015, both of which are hereby incorporated herein by reference in their entireties.

GOVERNMENT SPONSORSHIP

None.

FIELD OF THE DISCLOSURE

Embodiments are in the field of semiconductor devices. More particularly, embodiments disclosed herein relate to semiconductor devices and methods for manufacturing same via use of an epitaxial doped layer which, inter alia, achieve mobility of the device greater than 100 cm$^2$/Vs and carrier concentration of an epitaxial doped layer less than $10^{16}$ cm$^{-3}$.

BACKGROUND

Thin film manufacturing of advanced materials is widely employed in microelectronics, photovoltaics (PV), solid-state lighting, flat panel displays, magnetic hard drives, optics, and optoelectronics. In most of these and other applications, the thin films are deposited on rigid, small-area wafers in batch processes, which typically results in a high manufacturing cost when extended to large areas. The following examples in photovoltaics and large-area electronics illustrate the costs challenges.

III-V compound semiconductors (based on GaAs, InGaP etc.) are utilized in high-efficiency photovoltaics. These films are deposited by epitaxial growth on single crystal wafers such as Ge or GaAs. By far, the highest solar cell efficiencies have been achieved with III-V compound semiconductor PVs, including one-sun efficiencies over 37%. Unfortunately, these PVs are expensive because they rely on Ge or GaAs crystalline wafers, which could amount to up to 50% of the total module cost. Due to their high cost, the use of III-V compound semiconductor materials in terrestrial applications has been limited to concentrator PVs for the utilities industry.

Flexible electronics are being used for applications such as sensors, displays, radiation detectors, wearable and medical devices. Crystalline silicon fabrication platforms are costly and typically yields form factors not adequate for large scale, inexpensive flexible electronics. Hence, flexible electronics are typically made using amorphous silicon. However, the performance of amorphous silicon is far inferior to that of crystalline silicon, which limits the performance and capability of flexible electronics. For example, the carrier mobility values of amorphous silicon and organic semiconductors used in flexible electronics are about 1-10 cm$^2$/Vs compared to about 100 cm$^2$/Vs of polysilicon and about 500 cm$^2$/Vs of single-crystalline Si. As a result of the low carrier mobility, key performance metrics such as switching speed of thin film transistors (TFTs) fabricated with amorphous Si and organic semiconductors are far below that of TFTs made with crystalline silicon. The below Table 1 shows the differences in characteristics between crystalline and non-crystalline materials.

TABLE 1

Comparison of two major technological platforms in semiconductor electronics and photonics

|  | Crystalline Materials | Non-Crystalline Materials |
|---|---|---|
| Substrate | Single Crystal | Non-Single Crystal |
| Cost | High | Low |
| Performance Characteristics | Superior | Inferior |
| Versatility | Brittle | Flexible |
| Area | Small | Large |

As shown in Table 1, crystalline materials (e.g., crystalline silicon) have superior performance (i.e., high mobility), and are therefore suitable for small-area electronics, but are expensive and brittle. Non-crystalline materials (e.g., amorphous silicon) have lower performance (i.e., low mobility), but are inexpensive and flexible, and therefore suitable for large-area electronics.

To achieve fast-switching and high current thin film transistors for high performance flexible electronic devices, there is need in the art for epitaxial films with high mobility and low carrier concentration levels. Thus, there is need in the art for semiconductor devices and corresponding methods of manufacturing same which achieve high mobility and low carrier concentration levels.

Ion Beam Assisted Deposition (IBAD) has been demonstrated as a method to grow epitaxial films on inexpensive metal substrates. Currently, IBAD templates are being used to fabricate epitaxial germanium on inexpensive metal substrates to achieve a high mobility. Silicon is, however, used primarily in most flexible electronics applications. An e-beam evaporation process has been used to fabricate epitaxial silicon on IBAD template with a hole mobility of 89 cm$^2$/Vs at doping concentration 4.4×$10^{16}$ cm$^{-3}$. In the e-beam evaporation process, the silicon was grown on r-plane alumina, which suffers from a large lattice mismatch. To date, however, no one has been able to fabricate silicon films on flexible substrates with a mobility (i.e., of either or both the entire semiconductor device or the silicon film(s) themselves) higher than 100 cm$^2$/Vs or carrier concentration levels of the silicon film(s) of less than $10^{16}$ cm$^{-3}$.

Thus, there is need in the art for semiconductor devices and corresponding methods of manufacturing semiconductor devices by, inter alia, fabricating silicon on flexible substrates that will achieve high carrier mobility at low carrier concentration levels.

SUMMARY

Embodiments are directed to a semiconductor device comprising: a flexible substrate; a buffer stack overlying the substrate, wherein the buffer stack comprises at least one epitaxial buffer layer; and an epitaxial doped layer comprised predominantly of silicon and overlying the at least one epitaxial buffer layer. Mobility of the device is greater than 100 cm$^2$/Vs and carrier concentration of the epitaxial doped layer is less than $10^{16}$ cm$^{-3}$.

In an embodiment, mobility of the epitaxial doped layer is greater than 100 cm$^2$/Vs.

In an embodiment, the at least one epitaxial buffer layer is comprised predominantly of germanium.

In an embodiment, the flexible substrate comprises a non-single crystal material.

In an embodiment, the flexible substrate comprises a flexible material selected from the group consisting of metals, glasses, ceramics, and combinations thereof.

In an embodiment, the buffer stack comprises a biaxially-textured Ion Beam-Assisted Deposition (IBAD) layer.

In an embodiment, the epitaxial doped layer is at least 0.05 µm thick.

In an embodiment, the epitaxial doped layer is grown via plasma enhanced chemical vapor deposition.

In an embodiment, the buffer stack comprises an amorphous buffer layer positioned between the flexible substrate and the biaxially-textured IBAD layer.

In an embodiment, the semiconductor device further comprises an epitaxial undoped layer comprised predominantly of silicon and overlies the at least one epitaxial buffer layer, wherein the epitaxial doped layer overlies the epitaxial undoped layer.

In an embodiment, the epitaxial undoped layer is at least 0.5 µm thick.

In an embodiment, the epitaxial undoped layer is grown via plasma enhanced chemical vapor deposition.

Embodiments are also directed to a method for fabricating a semiconductor device. The method comprises: providing a flexible substrate; forming a buffer stack on the substrate, wherein the buffer stack comprises at least one epitaxial buffer layer; and forming an epitaxial doped layer comprised predominantly of silicon on the at least one epitaxial buffer layer. Mobility of the device is greater than 100 cm$^2$/Vs and carrier concentration of the epitaxial doped layer is less than $10^{16}$ cm$^{-3}$.

In an embodiment, mobility of the epitaxial doped layer is greater than 100 cm$^2$/Vs.

In an embodiment, the at least one epitaxial buffer layer is comprised predominantly of germanium.

In an embodiment, the flexible substrate comprises a non-single crystal material.

In an embodiment, the flexible substrate comprises a flexible material selected from the group consisting of metals, glasses, ceramics, and combinations thereof.

In an embodiment, the buffer stack comprises a biaxially-textured Ion Beam-Assisted Deposition (IBAD) layer.

In an embodiment, the epitaxial doped layer is at least 0.05 µm thick.

In an embodiment, the step of forming the epitaxial doped layer comprises growing the epitaxial doped layer via plasma enhanced chemical vapor deposition.

In an embodiment, the buffer stack comprises an amorphous buffer layer positioned between the flexible substrate and the biaxially-textured IBAD layer.

In an embodiment, the method further comprises forming an epitaxial undoped layer comprised predominantly of silicon on the at least one epitaxial buffer layer, and forming the epitaxial doped layer on the epitaxial undoped layer.

In an embodiment, the epitaxial undoped layer is at least 0.5 µm thick.

In an embodiment, the step of forming the epitaxial undoped layer comprises growing the epitaxial undoped layer via plasma enhanced chemical vapor deposition.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

DETAILED DESCRIPTION

It is to be understood that the figures and descriptions of the present invention may have been simplified to illustrate elements that are relevant for a clear understanding of the present invention, while eliminating, for purposes of clarity, other elements found in a typical semiconductor device or typical method for fabricating a semiconductor device. Those of ordinary skill in the art will recognize that other elements may be desirable and/or required in order to implement the present invention. However, because such elements are well known in the art, and because they do not facilitate a better understanding of the present invention, a discussion of such elements is not provided herein. It is also to be understood that the drawings included herewith only provide diagrammatic representations of the presently preferred structures of the present invention and that structures falling within the scope of the present invention may include structures different than those shown in the drawings. Reference will be made to the drawings wherein like structures are provided with like reference designations.

Before explaining at least one embodiment in detail, it should be understood that the inventive concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other invented devices, systems, methods, features, and advantages will be or become apparent to one with skill in the art upon examining the drawings and the detailed description herein. It's intended that all such additional devices, systems, methods, features, and advantages be protected by the accompanying claims.

For purposes of this disclosure, the terms "film" and "layer" may be used interchangeably.

It is an objective of the embodiments described herein to provide semiconductor devices and corresponding methods of manufacturing semiconductor devices with high carrier mobilities and low carrier concentrations.

In an embodiment, an epitaxial doped film that predominantly includes silicon (e.g., >50% silicon) (hereafter "epitaxial doped film") is grown on a flexible substrate and has a carrier mobility over 100 cm$^2$/Vs as well as a carrier concentration less than $10^{16}$ cm$^{-3}$. The carrier mobility of either or both the epitaxial doped film and the semiconductor device as a whole (i.e., including, inter alia, the epitaxial doped film, buffer stack (discussed below), and flexible substrate) is over 100 cm$^2$/Vs. The carrier concentration of the epitaxial doped film is less than $10^{16}$ cm$^{-3}$.

Figure 1:
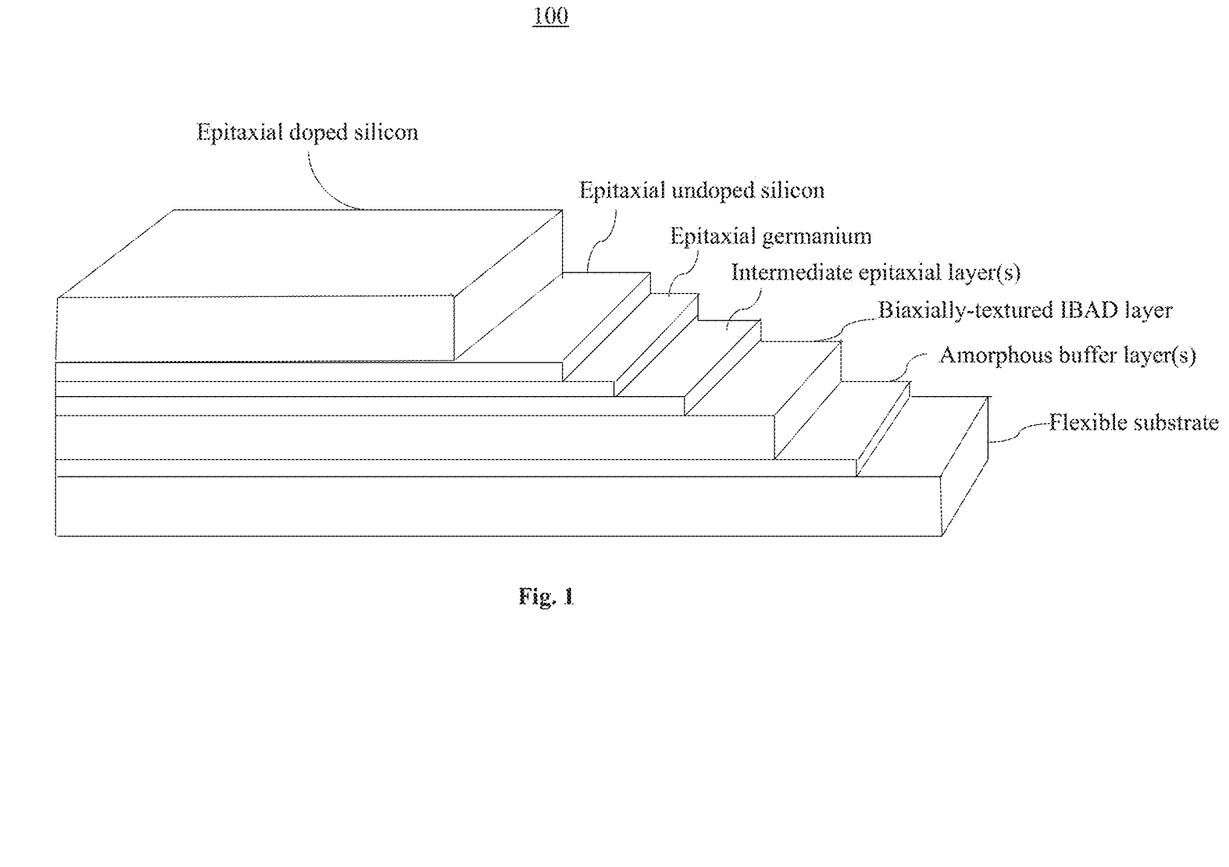
FIG. 1 illustrates an epitaxial silicon film grown on an inexpensive, flexible metal substrate, in accordance with an embodiment.

FIG. 1 illustrates a semiconductor device 100 including an epitaxial doped film with high carrier mobility and low carrier concentration. The epitaxial doped film includes epitaxial doped silicon stacked on top of an epitaxial buffer film that predominantly includes germanium (e.g., >50% germanium) (hereafter "epitaxial germanium film"), intermediate epitaxial layer(s), a biaxially-textured IBAD layer, amorphous buffer layer(s), and a flexible substrate. In one embodiment, the epitaxial doped film is grown on top of epitaxial germanium film. First, the epitaxial germanium film can be grown on a flexible metal or glass substrate using a known technique called ion-beam assisted deposition (IBAD). In the IBAD process, materials with rock-salt structures such as MgO are deposited on amorphous layers on any flexible substrate (e.g., glass, metal, ceramics, or combinations thereof), with simultaneous ion beam bombardment. Under proper conditions, within a first few nanometers of the film, a good degree of biaxial crystallographic orientation can be achieved. Grains are aligned with respect to each other both in-plane and out-of-plane, resembling a single-crystalline-like texture. Second, the epitaxial doped film is then deposited (formed) on the epitaxial germanium film via plasma enhanced chemical vapor deposition (PECVD). In one embodiment, an epitaxial undoped silicon layer is deposited on the epitaxial germanium film with at least 0.5 μm thickness followed by depositing (forming) an epitaxial doped film on the epitaxial undoped silicon layer.

Figure 2:
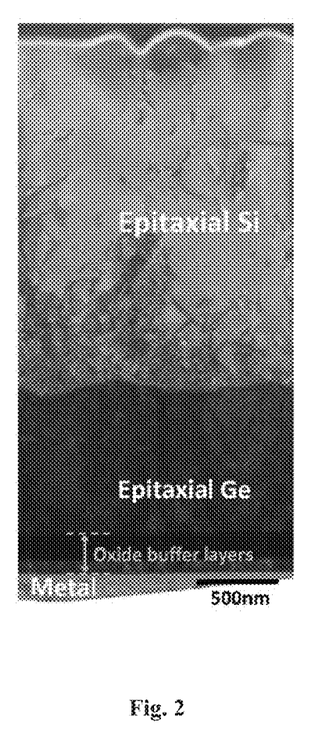
FIG. 2 illustrates a cross-sectional microstructure of an epitaxial silicon film grown on an inexpensive, flexible metal substrate, in accordance with an embodiment.

In an embodiment, the process for fabricating the epitaxial doped film of FIG. 1 results in an epitaxial doped film with only a few defects in the top region of the layer. FIG. 2 exhibits the cross-sectional microstructure of the epitaxial doped film described with respect to FIG. 1. As illustrated, the top part of the epitaxial doped film contains far fewer defects than the bottom part of the film. This is critical for achieving high electrical performance because the active device layers will be grown directly on top of the film (i.e., on top of the low defect density region).

Figure 3:
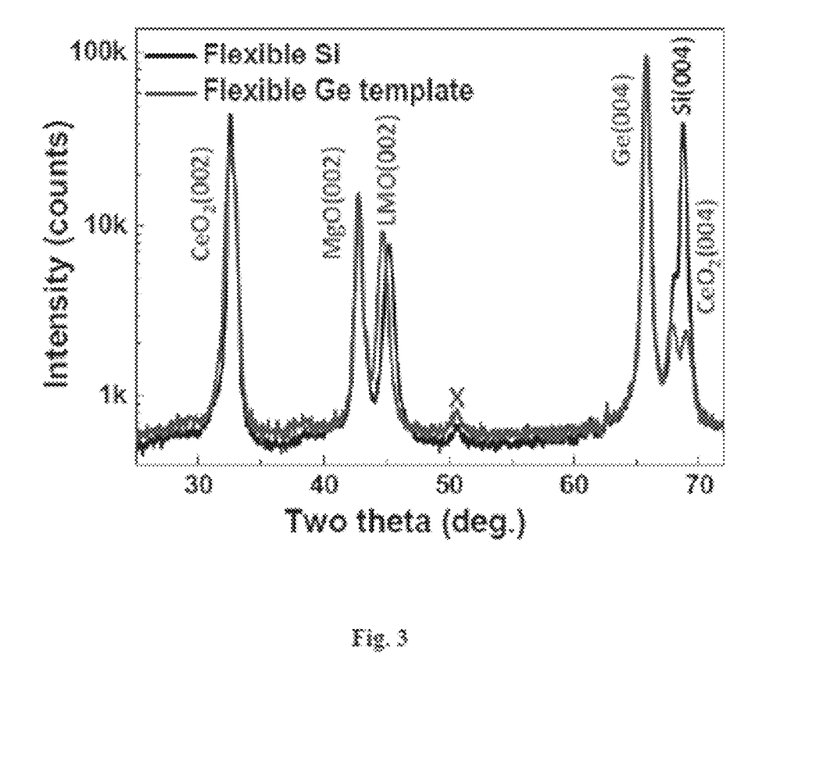
FIG. 3 illustrates a theta-2theta X-Ray Diffraction of an epitaxial silicon film grown on an inexpensive, flexible metal substrate, in accordance with an embodiment.
Figure 4:
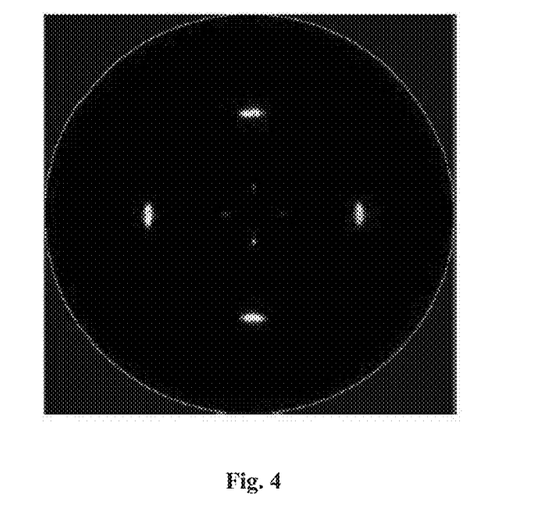
FIG. 4 illustrates an X-Ray Diffraction polefigure of an epitaxial silicon film grown on an inexpensive, flexible metal substrate, in accordance with an embodiment.
Figure 5:
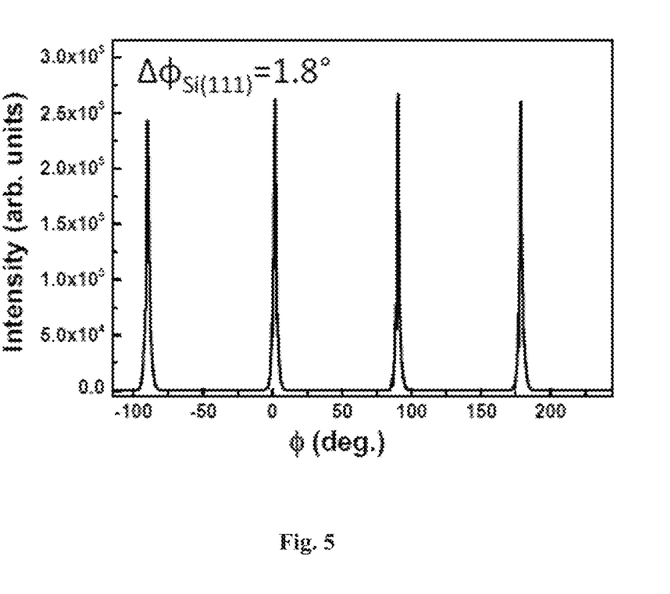
FIG. 5 illustrates an X-Ray Diffraction phi scan of an epitaxial silicon film grown on an inexpensive, flexible metal substrate, in accordance with an embodiment.
Figure 6:
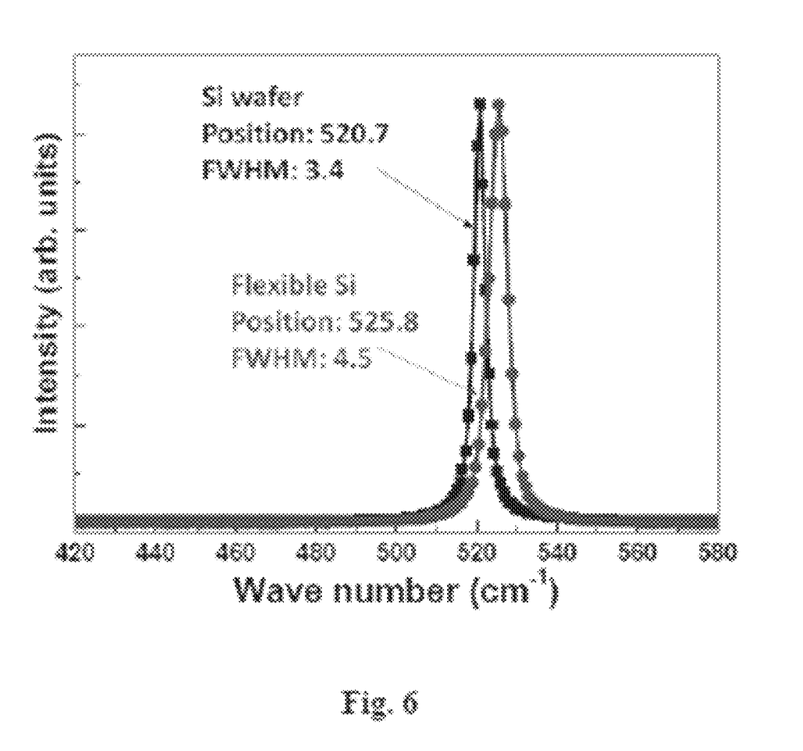
FIG. 6 illustrates a Raman Spectroscopy of an epitaxial silicon film grown on an inexpensive, flexible metal substrate, in accordance with an embodiment.

In an embodiment, the epitaxial doped film of FIG. 1 can have a sharp out-of-plane and in-plane texture, indicating strong epitaxial growth. FIG. 3 illustrates a theta-2theta pattern of the epitaxial doped film of FIG. 1 compared to a theta-2theta pattern of the epitaxial germanium film, which can be obtained by X-ray diffraction (XRD). As illustrated in FIG. 3, in the device of FIG. 1, the addition of the epitaxial doped film only results in a single XRD silicon peak, indicating strong out-of-plane texture. FIG. 4 illustrates an X-ray diffraction polefigure of the epitaxial doped film of FIG. 1. As illustrated in FIG. 4, the epitaxial doped film of FIG. 1 has four sharp poles corresponding to the four-fold symmetric peak positions silicon, indicating strong in-plane texture. Specifically, the polefigure shows no rings of polycrystalline structure or anything other than a single orientation of silicon. FIG. 5 illustrates a phi scan of the epitaxial doped film of FIG. 1. As illustrated in FIG. 5, the epitaxial doped film of FIG. 1 has only four sharp silicon peaks with a spread in in-plane texture of only approximately 1.8°. This indicates that the silicon grains are oriented with respect to each other within approximately 2.0° (i.e., strong in-plane texture). In an embodiment, the silicon grains are oriented with respect to each other between approximately 0.1° to 5°. FIG. 6 illustrates a Raman spectroscopy analysis of the epitaxial doped film of FIG. 1 compared to a silicon wafer as a reference. As illustrated in FIG. 6, there are no broad peaks corresponding to the presence of amorphous silicon in the epitaxial doped film of FIG. 1. Furthermore, the silicon peak from the epitaxial doped film of FIG. 1 is sharp with a full-width-at-maximum (FWHM) of 4.5°, which compares well with the 3.4° FWHM seen in the silicon wafer. Such a sharp peak of the epitaxial doped film on a metal substrate indicates crystal quality comparable with that of crystalline wafer, and hence, comparable electronic properties are expected.

Figure 7:
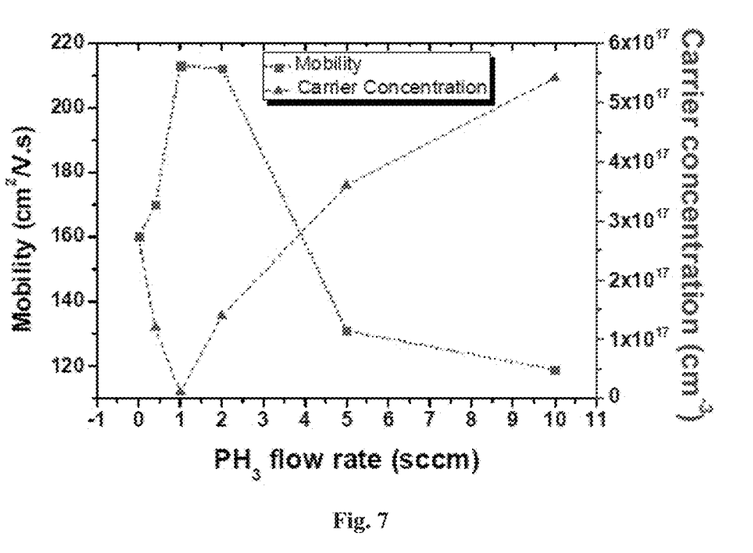
FIG. 7 illustrates mobility and carrier concentration levels of an epitaxial silicon film grown on an inexpensive, flexible metal substrate in phosphine gas flow, in accordance with an embodiment.

In an embodiment, the epitaxial doped film of FIG. 1 has a high mobility and low carrier concentration. FIG. 7 illustrates the mobility and carrier concentration levels of the epitaxial doped film of FIG. 1 with phosphine gas flow rate. The mobility and carrier concentration measurements can be conducted at different levels of PH$_3$ flow rates. As illustrated in FIG. 7, mobility and carrier concentration levels are sensitive to the flow rate of the phosphine source. The mobility peaks at ~213 cm$^2$/Vs, and the carrier concentration dips to ~$10^{16}$ cm$^{-3}$ at a phosphine flow rate of 1 sccm.

Figure 8:
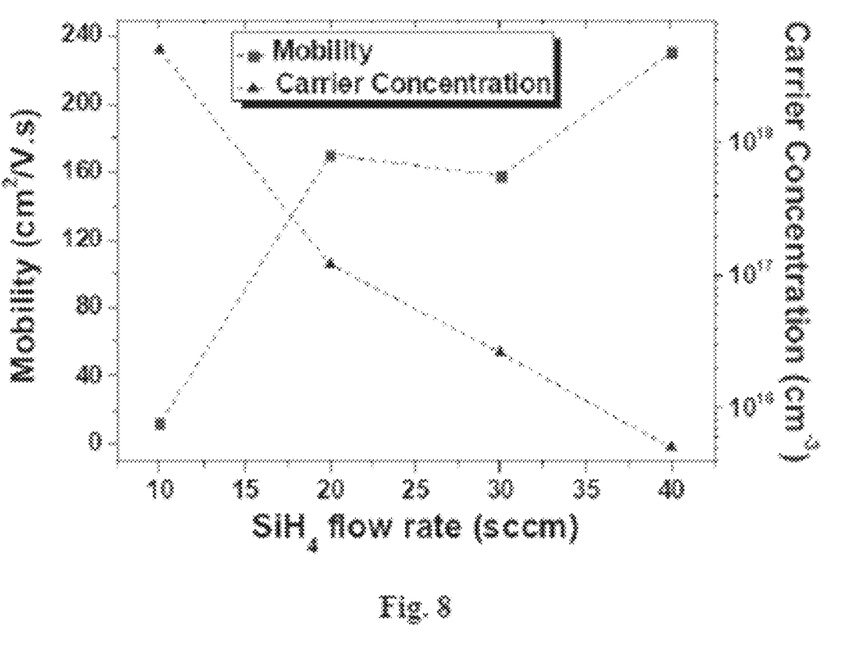
FIG. 8 illustrates mobility and carrier concentration levels of an epitaxial silicon film grown on an inexpensive, flexible metal substrate in silane gas flow, in accordance with an embodiment.
Figure 9:
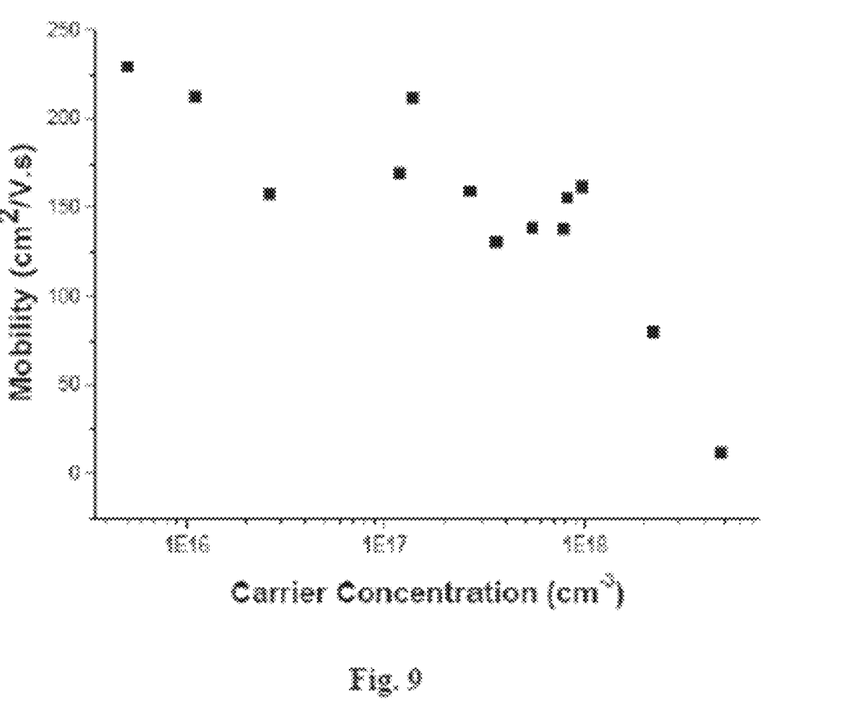
FIG. 9 illustrates the trend of mobility and carrier concentration levels of an epitaxial silicon film grown on an inexpensive, flexible metal substrate, in accordance with an embodiment.

FIG. 8 illustrates the mobility and carrier concentration levels of the epitaxial doped film of FIG. 1 with silane gas flow rate. The mobility and carrier concentration measurements can be conducted at different levels of silane flow rates. As illustrated in FIG. 8, mobility and carrier concentration levels are sensitive to the flow rate of the silane source. The mobility peaks at ~236 cm$^2$/Vs, and the carrier concentration dips to $10^{15}$ cm$^{-3}$ at a silane flow rate of 40 sccm. Therefore, with controlled reactant gas flows, the epitaxial doped film of FIG. 1 can achieve a mobility boost upwards of ~236 cm$^2$/Vs, compared to the ~80 cm$^2$/Vs observed in prior art films. The epitaxial doped film can also achieve a carrier concentration drop to $10^{15}$ cm$^{-3}$, compared to the $10^{16}$ cm$^{-3}$ observed in prior art films.

Embodiments are directed to a semiconductor device comprising: a flexible substrate; a buffer stack overlying the substrate, wherein the buffer stack comprises at least one epitaxial buffer layer; and an epitaxial doped layer comprised predominantly of silicon and overlying the at least one epitaxial buffer layer. Mobility of the device is greater than 100 cm$^2$/Vs and carrier concentration of the epitaxial doped layer is less than $10^{16}$ cm$^{-3}$.

In an embodiment, mobility of the epitaxial doped layer is greater than 100 cm$^2$/Vs.

In an embodiment, the at least one epitaxial buffer layer is comprised predominantly of germanium.

In an embodiment, the flexible substrate comprises a non-single crystal material.

In an embodiment, the flexible substrate comprises a flexible material selected from the group consisting of metals, glasses, ceramics, and combinations thereof.

In an embodiment, the buffer stack comprises a biaxially-textured Ion Beam-Assisted Deposition (IBAD) layer.

In an embodiment, the epitaxial doped layer is at least 0.05 µm thick.

In an embodiment, the epitaxial doped layer is grown via plasma enhanced chemical vapor deposition.

In an embodiment, the buffer stack comprises an amorphous buffer layer positioned between the flexible substrate and the biaxially-textured IBAD layer.

In an embodiment, the semiconductor device further comprises an epitaxial undoped layer comprised predominantly of silicon and overlies the at least one epitaxial buffer layer, wherein the epitaxial doped layer overlies the epitaxial undoped layer.

In an embodiment, the epitaxial undoped layer is at least 0.5 µm thick.

In an embodiment, the epitaxial undoped layer is grown via plasma enhanced chemical vapor deposition.

Figure 10:
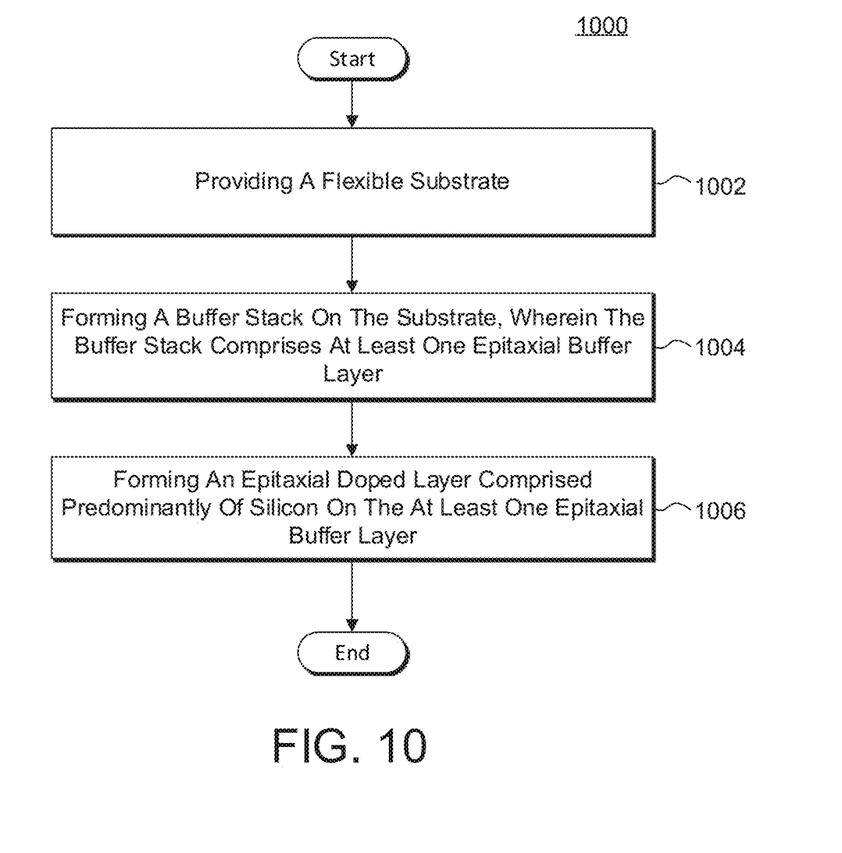
FIG. 10 is a flowchart illustrating an embodiment of a method for fabricating a semiconductor device having high mobility and low carrier concentration levels, in accordance with an embodiment.

Embodiments are also directed to a method for fabricating a semiconductor device. FIG. 10 is a flowchart illustrating an embodiment of a method 1000 for fabricating a semiconductor device. In an embodiment, the method comprises providing a flexible substrate (block 1002). The method also comprises forming a buffer stack on the substrate, wherein the buffer stack comprises at least one epitaxial buffer layer (block 1004). The method further comprises forming an epitaxial doped layer comprised predominantly of silicon on the at least one epitaxial buffer layer (block 1006). Mobility of the device is greater than 100 cm$^2$/Vs and carrier concentration of the epitaxial doped layer is less than $10^{16}$ cm$^{-3}$.

In an embodiment, mobility of the epitaxial doped layer is greater than 100 cm$^2$/Vs.

In an embodiment, the at least one epitaxial buffer layer is comprised predominantly of germanium.

In an embodiment, the flexible substrate comprises a non-single crystal material.

In an embodiment, the flexible substrate comprises a flexible material selected from the group consisting of metals, glasses, ceramics, and combinations thereof.

In an embodiment, the buffer stack comprises a biaxially-textured Ion Beam-Assisted Deposition (IBAD) layer.

In an embodiment, the epitaxial doped layer is at least 0.05 µm thick.

In an embodiment, the step of forming the epitaxial doped layer comprises growing the epitaxial doped layer via plasma enhanced chemical vapor deposition.

In an embodiment, the buffer stack comprises an amorphous buffer layer positioned between the flexible substrate and the biaxially-textured IBAD layer.

In an embodiment, the method further comprises forming an epitaxial undoped layer comprised predominantly of silicon on the at least one epitaxial buffer layer, and forming the epitaxial doped layer on the epitaxial undoped layer.

In an embodiment, the epitaxial undoped layer is at least 0.5 µm thick.

In an embodiment, the step of forming the epitaxial undoped layer comprises growing the epitaxial undoped layer via plasma enhanced chemical vapor deposition.

Although embodiments are described above with reference to carrier mobility of the epitaxial doped film being over 100 cm$^2$/Vs, the carrier mobility of the semiconductor device as a whole (i.e., including, inter alia, the epitaxial doped film, buffer stack, and flexible substrate) is also over 100 cm$^2$/Vs.

The method steps in any of the embodiments described herein are not restricted to being performed in any particular order. Also, structures mentioned in any of the method embodiments may utilize structures mentioned in any of the device embodiments. Such structures may be described in detail with respect to the device embodiments only but are applicable to any of the method embodiments.

Features in any of the embodiments described above may be employed in combination with features in other embodiments described above, such combinations are considered to be within the spirit and scope of the present invention.

The contemplated modifications and variations specifically mentioned above are considered to be within the spirit and scope of the present invention.

It's understood that the above description is intended to be illustrative, and not restrictive. The material has been presented to enable any person skilled in the art to make and use the concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the embodiments herein therefore should be determined with reference to the appended claims, along with the full scope of equivalents to which such claims are entitled. In the appended claims, the terms "including" and "in which" are used as the plain-English equivalents of the respective terms "comprising" and "wherein."

EXAMPLE

A flexible tape of Hastelloy C-276 was electropolished to a surface roughness of 1 nm. A buffer stack consisting of Al$_2$O$_3$, Y$_2$O$_3$, MgO, LaMnO3, CeO2, and epitaxial germanium film were deposited on the substrate. The MgO was deposited by ion beam-assisted deposition to achieve a biaxial texture. This biaxial texture was transferred epitaxially to subsequent layers. A 300-1000 nm thick germanium film was epitaxially grown on the CeO2 layer. The germanium film was annealed at 750° C. for 10 minutes at a base pressure of 2.5×10$^{-7}$ Torr. Next, the germanium film was cleaned and smoothened with a hydrogen plasma at a power level of 300 W for 5 min. 80 sccm H2 was used at a pressure of 75 mTorr. Then, a 1 µm thick undoped layer of silicon was epitaxially grown on the germanium film by plasma enhanced chemical vapor deposition at 300 W and pressure of 75 mTorr using a reactive gas of 40 sccm SiH4 and dilution gas of 120 sccm H2. This gas flow was then continued with an additional dopant flow of 0.4 sccm PH3 for 20 minutes. The deposition of the n-doped epitaxial silicon (i.e., the epitaxial doped film) was conducted at 300 W and 75 mTorr.

What is claimed is:

1. A semiconductor device comprising:
   a flexible substrate;
   a buffer stack overlying the substrate, wherein the buffer stack comprises at least one epitaxial buffer layer; and
   an epitaxial doped layer comprised predominantly of silicon and overlying the at least one epitaxial buffer layer;
   wherein mobility of the device is greater than 100 cm$^2$/Vs.

2. The semiconductor device of claim 1, wherein mobility of the epitaxial doped layer is greater than 100 cm$^2$/Vs.

3. The semiconductor device of claim 1, wherein the at least one epitaxial buffer layer comprises an epitaxial non-oxide buffer layer.

4. The semiconductor device of claim 1, wherein the at least one epitaxial buffer layer is comprised predominantly of germanium.

5. The semiconductor device of claim 1, wherein the flexible substrate comprises a non-single crystal material.

6. The semiconductor device of claim 1, wherein the flexible substrate comprises a flexible material selected from the group consisting of metals, glasses, ceramics, and combinations thereof.

7. The semiconductor device of claim 1, wherein the buffer stack comprises a biaxially-textured Ion Beam-Assisted Deposition (IBAD) layer.

8. The semiconductor device of claim 1, wherein the epitaxial doped layer is at least 0.05 µm thick.

9. The semiconductor device of claim 1, wherein the buffer stack comprises an amorphous buffer layer positioned between the flexible substrate and the biaxially-textured IBAD layer.

10. The semiconductor device of claim 1, further comprising an epitaxial undoped layer comprised predominantly of silicon and overlying the at least one epitaxial buffer layer, wherein the epitaxial doped layer overlies the epitaxial undoped layer.

11. The semiconductor device of claim 10, wherein the epitaxial undoped layer is at least 0.5 µm thick.

12. A method for fabricating a semiconductor device, the method comprising:
providing a flexible substrate;
forming a buffer stack on the substrate, wherein the buffer stack comprises at least one epitaxial buffer layer; and
forming an epitaxial doped layer comprised predominantly of silicon on the at least one epitaxial buffer layer;
wherein mobility of the device is greater than 100 $cm^2/Vs$.

13. The method of claim 12, wherein mobility of the epitaxial doped layer is greater than 100 $cm^2/Vs$.

14. The method of claim 12, wherein the at least one epitaxial buffer layer comprises an epitaxial non-oxide buffer layer.

15. The method of claim 12, wherein the at least one epitaxial buffer layer is comprised predominantly of germanium.

16. The method of claim 12, wherein the flexible substrate comprises a non-single crystal material.

17. The method of claim 12, wherein the flexible substrate comprises a flexible material selected from the group consisting of metals, glasses, ceramics, and combinations thereof.

18. The method of claim 12, wherein the buffer stack comprises a biaxially-textured Ion Beam-Assisted Deposition (IBAD) layer.

19. The method of claim 12, wherein the step of forming the epitaxial doped layer comprises growing the epitaxial doped layer via plasma enhanced chemical vapor deposition.

20. The method of claim 12, wherein the buffer stack comprises an amorphous buffer layer positioned between the flexible substrate and the biaxially-textured IBAD layer.

21. The method of claim 12, further comprising forming an epitaxial undoped layer comprised predominantly of silicon on the at least one epitaxial buffer layer, and forming the epitaxial doped layer on the epitaxial undoped layer.

22. The method of claim 21, wherein the step of forming the epitaxial undoped layer comprises growing the epitaxial undoped layer via plasma enhanced chemical vapor deposition.

* * * * *